United States Patent
Kasai

(10) Patent No.: US 9,575,420 B2
(45) Date of Patent: Feb. 21, 2017

(54) LITHOGRAPHY APPARATUS AND ARTICLE MANUFACTURING METHOD

(71) Applicant: CANON KABUSHIKI KAISHA, Tokyo (JP)

(72) Inventor: Ryo Kasai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/562,871

(22) Filed: Dec. 8, 2014

(65) Prior Publication Data

US 2015/0160570 A1 Jun. 11, 2015

(30) Foreign Application Priority Data

Dec. 10, 2013 (JP) ................... 2013-255376

(51) Int. Cl.
*G03B 27/52* (2006.01)
*G03B 27/42* (2006.01)
*G03F 7/20* (2006.01)

(52) U.S. Cl.
CPC .......... *G03F 7/70925* (2013.01); *G03F 7/707* (2013.01); *G03F 7/7085* (2013.01)

(58) Field of Classification Search
CPC .......... G03F 7/70341; G03F 7/70925
USPC ............ 355/30, 53, 72–76; 356/237.2
See application file for complete search history.

(56) References Cited

U.S. PATENT DOCUMENTS

| 6,392,738 B1* | 5/2002 | van de Pasch | G03F 7/707 355/30 |
| 8,174,668 B2* | 5/2012 | Kobayashi | G03B 27/52 355/30 |
| 2006/0001847 A1* | 1/2006 | De Jager | G03F 7/70275 355/30 |
| 2009/0020137 A1* | 1/2009 | Osawa | B08B 7/0042 134/1.3 |

FOREIGN PATENT DOCUMENTS

JP 07-066114 A 3/1995

* cited by examiner

Primary Examiner — Hung Henry Nguyen
(74) Attorney, Agent, or Firm — Rossi, Kimms & McDowell LLP

(57) ABSTRACT

A lithography apparatus includes a cleaning unit configured to perform cleaning of a substrate holder, a detector configured to detect a foreign substance by observing a substrate held by the substrate holder, and a controller configured to control execution of a pattern forming operation on the substrate and a cleaning operation. The controller operates such that, if a foreign substance is detected out of a predetermined area including a position at which a foreign substance was previously detected after a predetermined number of executions of the cleaning operation, a next pattern forming operation is performed after executing the cleaning operation. Otherwise, a next pattern forming operation is performed without executing the cleaning operation.

18 Claims, 10 Drawing Sheets

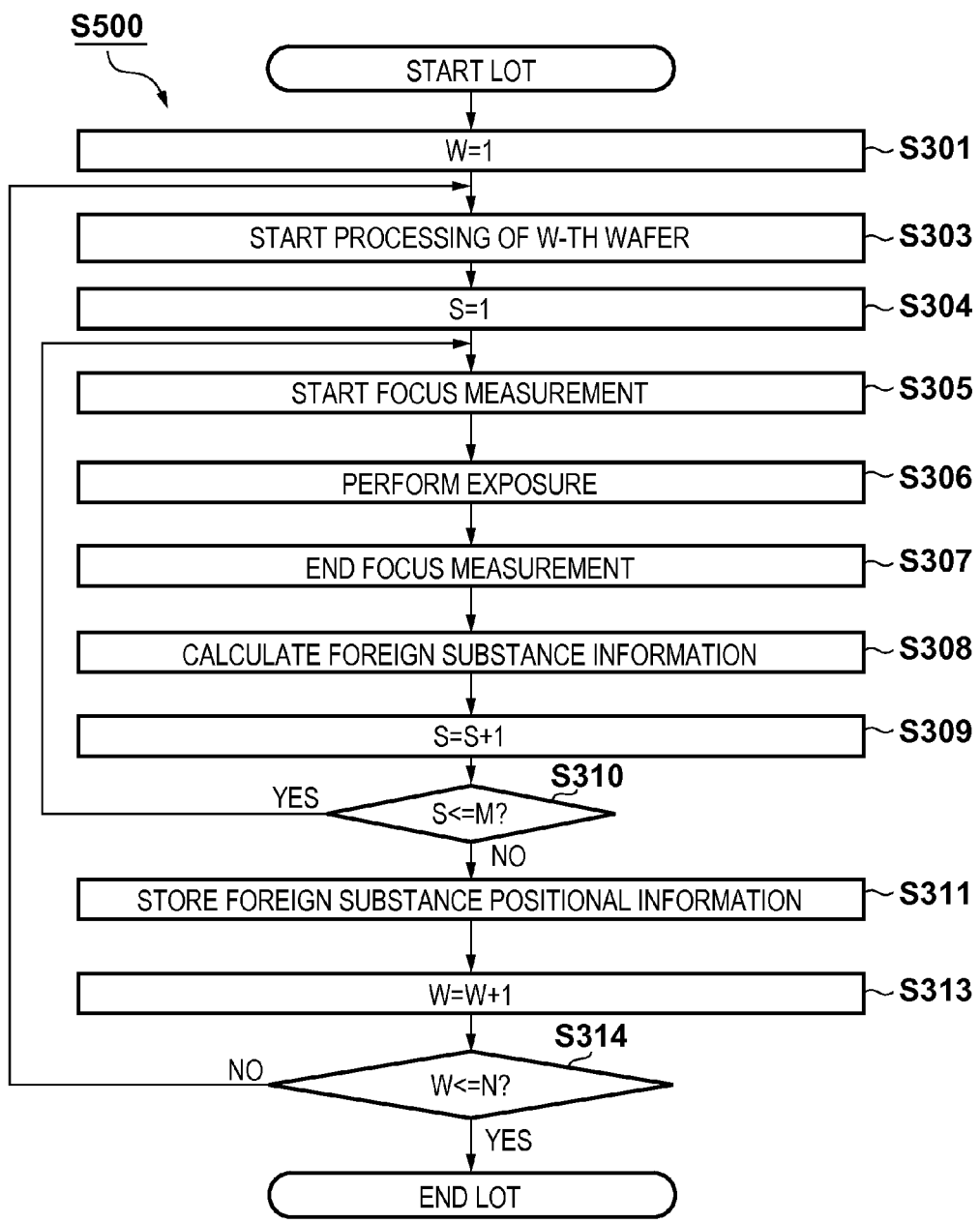

WAFER MAP

DEFOCUS AMOUNT [nm]

HOTSPOT DETECTION POSITION AND VALUE

— WAFER STAGE DRIVE TARGET POSITION
○ FOCUS SENSOR VALUE

WAFER AT WHICH FOREIGN SUBSTANCE IS DETECTED

FOREIGN SUBSTANCE

— WAFER STAGE DRIVE TARGET POSITION
○ FOCUS SENSOR VALUE

FOCUS TRACKING IMPROVEMENT

FOREIGN SUBSTANCE

LITHOGRAPHY APPARATUS AND ARTICLE MANUFACTURING METHOD

BACKGROUND OF THE INVENTION

Field of the Invention

The present invention relates to a lithography apparatus and an article manufacturing method.

Description of the Related Art

In semiconductor exposure apparatuses, the position in the translation direction of an original stage and a wafer (substrate) stage is precisely controlled using a laser length measuring machine in order to achieve a highly precise resolving power. Furthermore, regarding the vertical direction of the original stage and the wafer stage, the distance and the tilt between a wafer face and an optical system image face are measured using a focus sensor, and the wafer stage is driven for scanning. At that time, the drive is sequentially controlled in the Z (focus) direction and the tilt direction in order to cause the wafer face match the image face simultaneously when driving the wafer stage for scanning.

However, if a wafer is placed and exposure is started in a state where a foreign substance has adhered to a wafer chuck, which is a substrate holder, the image is locally defocused, and a resolution failure may occur. Examples of the foreign substance include resist that was removed from a wafer and has adhered to the wafer chuck. If a resolution failure is caused by a foreign substance during exposure, the yield in the chip production may be lowered.

Accordingly, on production site of semiconductors, much attention is paid particularly to such foreign substances on a wafer chuck, and countermeasures are taken, such as regularly cleaning the chuck using a cleaning unit. Furthermore, wafer exposure processing is performed between intervals of regular wafer chuck cleaning.

Highly adhesive foreign substances such as resist residue may not be removed merely by polish cleaning. Also in a case where contact with the wafer chuck is insufficient due to warping of the cleaning plate or manufacturing errors and polishing cannot be sufficiently performed, foreign substances may not be removed. If the production is continued without removing foreign substances, the foreign substances are detected in each lot, and the production is temporality stopped and cleaning operation is executed, so that the productivity is lowered.

Japanese Patent Laid-Open No. 7-066114 discloses control in which, if a foreign substance on a wafer holder is not removed even by cleaning of the wafer holder, a warning is issued and the procedure does not advance to exposure processing.

According to Japanese Patent Laid-Open No. 7-066114, if a warning is issued, the procedure does not advance to the exposure processing unless the foreign substance is removed. Thus, the substrate holder has to be detached from the apparatus and cleaned in an external cleaning apparatus such as a washing machine so that the foreign substance is removed, and, thus, the apparatus has to be stopped for several hours to a whole day.

Meanwhile, preventing the productivity from being lowered to the extent possible is also an important demand in the semiconductor manufacture.

SUMMARY OF THE INVENTION

According to one aspect of the present invention, a lithography apparatus for forming a pattern on a substrate comprises a substrate holder configured to hold the substrate, a cleaning unit configured to perform cleaning of the substrate holder, a detector configured to detect a foreign substance by observing the substrate held by the substrate holder, and a controller configured to control execution of a pattern forming operation on the substrate and a cleaning operation by the cleaning unit, wherein the controller operates such that, in a case where a foreign substance is detected out of a predetermined area including a position at which a foreign substance was previously detected after a predetermined number of executions of the cleaning operation, a next pattern forming operation is performed after executing the cleaning operation, and in a case where a foreign substance is detected again within a predetermined area including a position at which a foreign substance was previously detected after the predetermined number of executions of the cleaning operation, a next pattern forming operation is performed without executing the cleaning operation.

Further features of the present invention will become apparent from the following description of exemplary embodiments with reference to the attached drawings.

BRIEF DESCRIPTION OF THE DRAWINGS

FIG. 5 is a flowchart of a lot processing sequence in a third embodiment.

DESCRIPTION OF THE EMBODIMENTS

Various exemplary embodiments, features, and aspects of the invention will be described in detail below with reference to the drawings.

Hereinafter, preferred embodiments of the present invention will be described in detail with reference to the accompanying drawings. It should be noted that the following embodiments are not to be construed as limiting the invention, but as illustrating specific examples that are advantageous for the implementation of the present invention. In addition, all of the combinations of features that are described in the following embodiments are not necessarily essential to the problem solving means of the present invention.

First Embodiment

Figure 1:
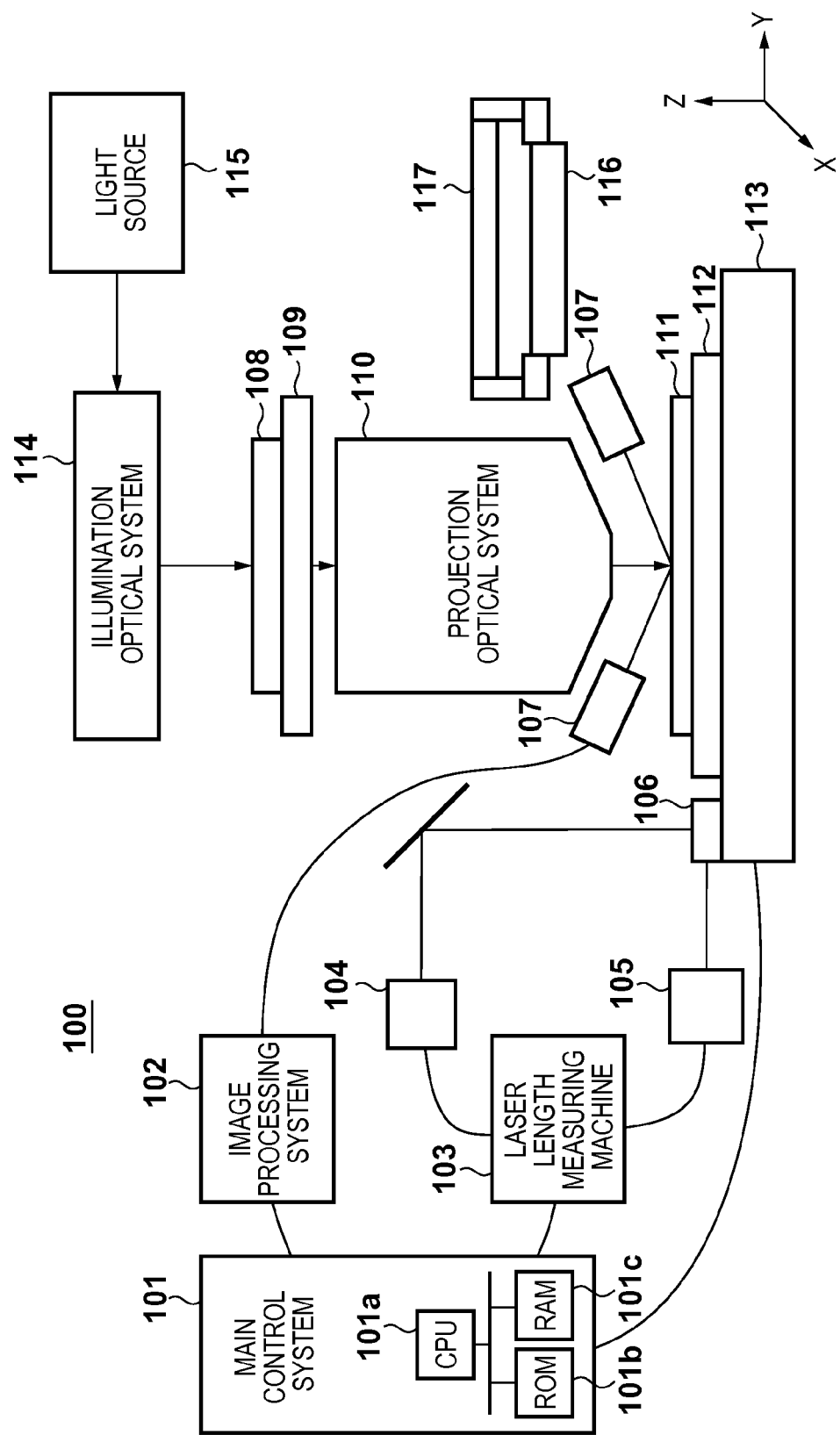
FIG. 1 is a diagram showing the configuration of an exposure apparatus in embodiments.

FIG. 1 is a diagram showing the configuration of an exposure apparatus 100, which is an exemplary lithography apparatus for forming a pattern on a substrate, in this embodiment. In the exposure apparatus 100, an original stage 109 holds an original 108 such as a reticle. Light from a light source 115 is irradiated by an illumination optical system 114 onto a mask or the original 108 held on the original stage 109. Then, the light that has been transmitted through the original 108 is projected by a projection optical system 110 onto a wafer 111, which is a substrate. At that time, the wafer 111 is held on a wafer chuck 112, which is a substrate holder. The wafer chuck 112 (hereinafter, it may be simply referred to as "chuck") is supported on a wafer stage 113.

The wafer stage 113 has a drive mechanism along six axes consisting of X, Y, Z, ωX, ωY, and ωZ, and is driven based on an instruction value from a main control system 101. The current position of the wafer stage 113 is obtained by irradiating light from laser heads 104 and 105 onto a mirror 106 on the wafer stage, measuring reflected light thereof using a laser length measuring machine 103, and converting the obtained value into an orientation amount. The main control system 101 acquires the current position of the wafer stage 113 from the laser length measuring machine 103, and generates a new drive instruction value and provides feedback, thereby maintaining the orientation of the wafer stage 113.

A pair of focus sensors 107 form an exemplary detector for detecting a foreign substance by observing a wafer held on the wafer stage 113. The pair of focus sensors 107 are arranged in the Y-axis direction so as to sandwich a position near the emitting unit of the projection optical system 110, so that a sensor on one side irradiates oblique incident light on the wafer 111 at a prescribed pitch following the scanning exposure, and the sensor on the other side receives the reflected light. Next, an image processing system 102 converts the amount of light received into a Z displacement amount, and the main control system 101 calculates approximate plane from the Z displacement amount of each point in a region. Then, the drive instruction values on Z, ωX, and ωY of the wafer stage 113 are changed such that the surface of the wafer 111 matches the projected image of the original 108 projected via the projection optical system 110.

A cleaning unit 117 has a mechanism for holding a cleaning plate 116 and the wafer chuck 112. The cleaning unit 117 brings the cleaning plate 116 into contact with the wafer chuck 112, and driving the wafer stage 113 or the cleaning unit 117 in the XY-plane direction, thereby performing polishing to remove a foreign substance on the wafer chuck 112.

The main control system 101 is a controller for comprehensively controlling each unit of the exposure apparatus 100, and includes, for example, a CPU 101a, a ROM 101b for holding control programs and fixed data, and an RAM 101c for holding a work area of the CPU 101a and temporary data. In particular, the main control system 101 according to this embodiment controls the execution of a pattern forming operation on a wafer and a cleaning operation by the cleaning unit. In this embodiment, the pattern forming operation includes focus control of the projection optical system using the focus sensors.

Figure 8:
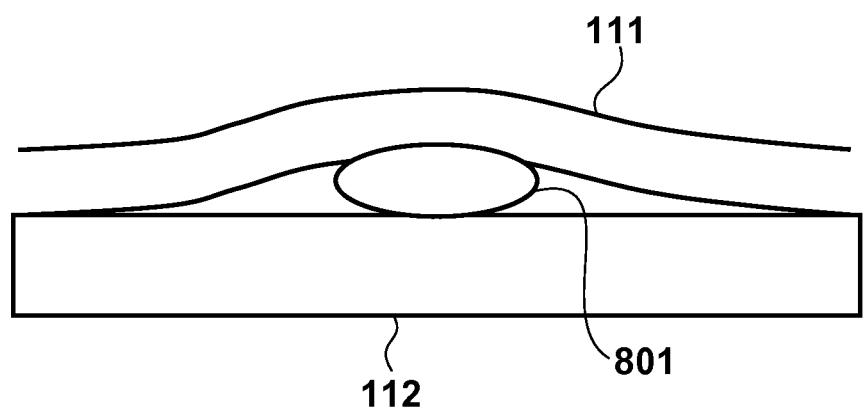
FIG. 8 is a schematic view showing a foreign substance on a wafer chuck.

FIG. 8 is a schematic view showing a foreign substance on the wafer chuck 112. When the wafer 111 is loaded, a foreign substance 801 is sandwiched between the wafer 111 and the wafer chuck 112.

Figure 9:
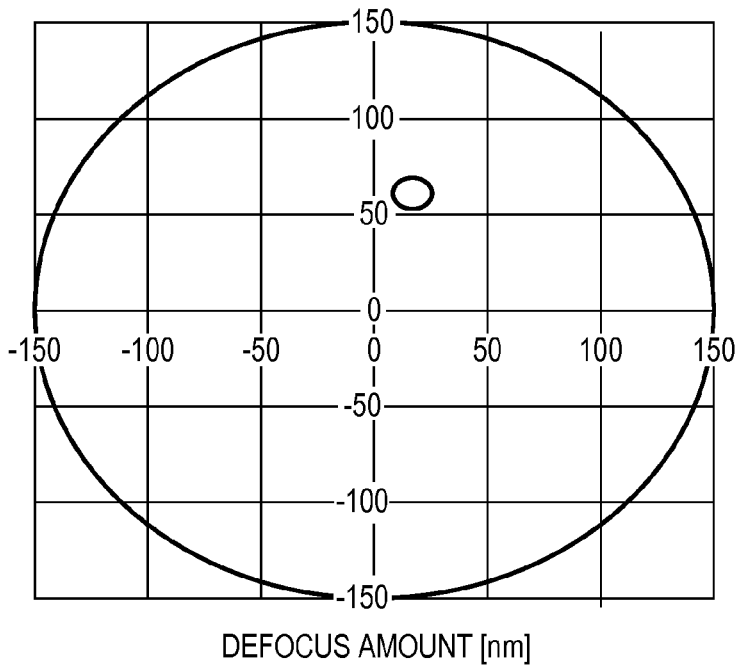
FIG. 9 is a two-dimensional bubble map indicating the position of a foreign substance on the wafer chuck.

FIG. 9 is a two-dimensional bubble map indicating the position of a foreign substance on the wafer chuck 112. The horizontal axis and the vertical axis of the map respectively indicate the X axis and the Y axis of the wafer 111 in FIG. 1.

Figure 10:
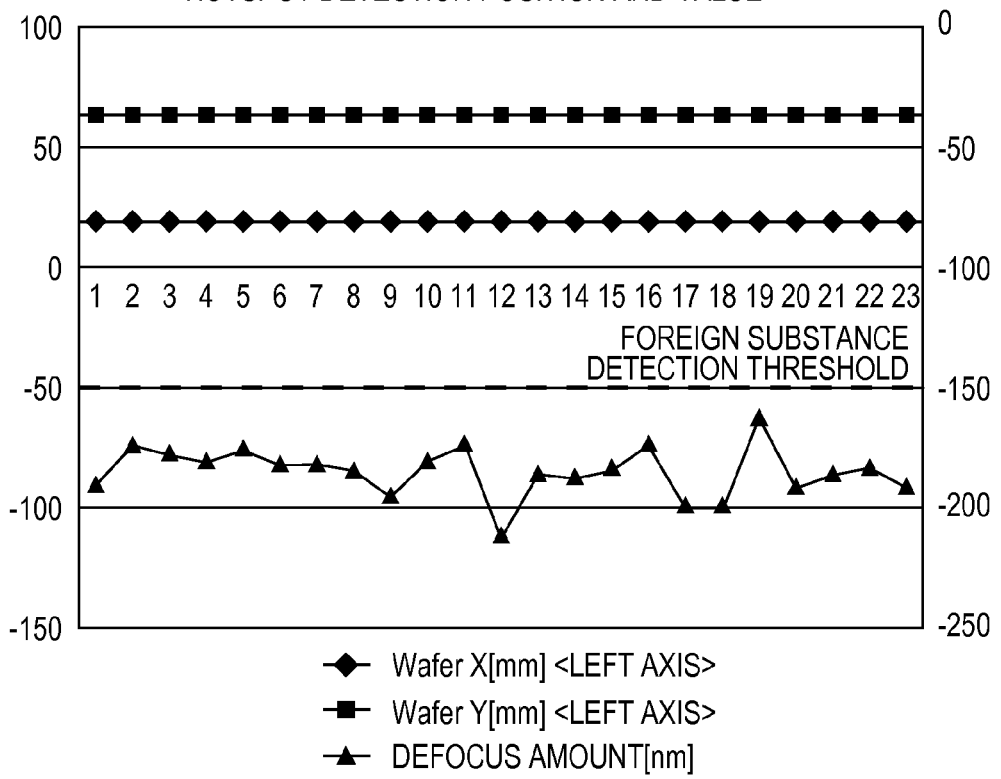
FIG. 10 is a graph indicating the position and the size of a foreign substance on the wafer chuck.

FIG. 10 is a graph indicating the position and the size of a foreign substance for each wafer shown as in FIG. 9. The horizontal axis of the graph indicates the number of wafers, the vertical axis (left) indicates the XY coordinates of the wafer 111 in FIG. 1, and the vertical axis (right) indicates the size of a foreign substance. The size of a foreign substance is indicated in a defocus amount. In FIG. 10, the XY coordinates of a foreign substance whose defocus amount exceeds a foreign substance detection threshold does not change from wafer to wafer, which means that the foreign substance remains at the same position on the wafer chuck 112 even after wafers are replaced.

Figure 2:
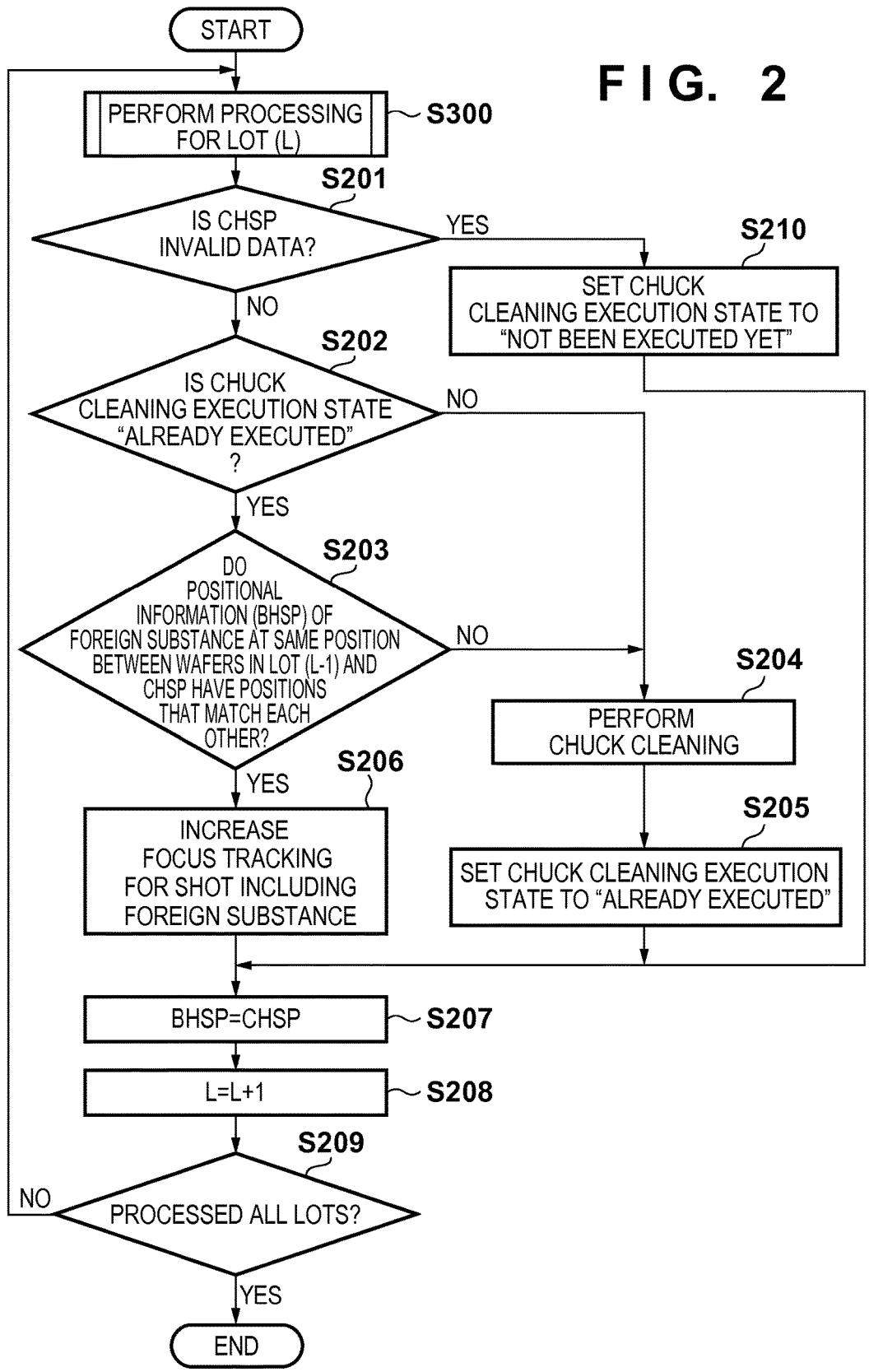
FIG. 2 is a flowchart of a lot processing sequence in a first embodiment.

FIG. 2 is a flowchart of a lot processing sequence. A program corresponding to this flowchart is, for example, stored in the ROM 101b and executed by the CPU 101a.

In S300, exposure processing for one lot is executed. The exposure processing for one lot is shown in detail in FIG. 3. First, a wafer number W subjected to processing is initialized to 1 (S301). Next, the positional information (CHSP) of a foreign substance present at the same position between wafers is invalidated (S302). The CHSP is, for example, XY coordinate data, and there are such data sets for a plurality of points. Examples of the invalidating method include substituting a predetermined value (999999, etc.) that cannot be the coordinate value, for the CHSP.

The conveyed W-th wafer is held on the wafer chuck 112, and the processing is started (S303). Then, a shot number S subjected to processing is initialized to 1 (S304). Subsequently, according to a shot layout parameter set for each job, the wafer stage 113 is driven to a scanning exposure start position for that shot. The scan is started in a state where the original stage 109 and the wafer stage 113 are in synchronization, focus measurement by the focus sensors 107 and focus control by the main control system 101 are started (S305). In S306, conditions such as the energy amount of pulses oscillated from the light source 115 for performing exposure at an exposure amount set for each job, the oscillating frequency, an unshown neutral density filter inside the illumination optical system 114, and the scanning speed of the wafer stage 113 are determined, and the exposure is performed. When the wafer stage 113 is driven to a position outside the exposure region for that shot, the focus measurement is ended (S307). In S308, a focus control error (defocus amount) between the processes in S305 to S307 is calculated, and is compared with a foreign substance determination threshold. The foreign substance determination threshold may be provided as a job parameter such that the tolerance can be changed for each process. In S309, the shot number S is incremented. In S310, a total shot number M and the shot number S are compared, and, if the shot number S is not greater than the total shot number M, the procedure returns to S305, and S305 to S309 are repeated.

If the shot number S is greater than the total shot number M, the procedure advances to S311. In S311, a position and a value of those determined as foreign substances in all shots in the wafer are stored as foreign substance positional information in the RAM 101c. In S312, if the foreign substance is detected at the same position in a prescribed number X of successive wafers including the W-th wafer, the positional information X,Y is stored as CHSP in the RAM 101c. Whether or not the positions are the same is determined according to whether or not the XY coordinates of the detected positions are within a predetermined range.

Next, the wafer number W is incremented by 1 (S313). Subsequently, a total wafer number N in the lot and the wafer number W are compared (S314), and, if the wafer number W is not greater than the total wafer number N, the procedure returns to S302, and the processes are repeated. If the wafer number W is greater than the total wafer number N, the lot processing is ended.

If the above-described exposure operation for one lot is ended, the procedure advances to S201 in FIG. 2. In S201, it is determined whether or not the CHSP is invalid data. If the CHSP is not invalid data, it is judged that there is a foreign substance on the chuck, and the procedure advances to S202. If it is judged that there is no foreign substance, the procedure advances to S210. In S210, the variable for the chuck cleaning execution state is set to a value indicating that the chuck cleaning has not been executed yet, and is stored in the RAM 101c.

In S202, it is determined whether or not the variable for the chuck cleaning execution state is a value indicating that the chuck cleaning has been already executed. If the chuck cleaning has been already executed, there is a possibility that the chuck cleaning was previously executed but was not enough to realize the removal effect, and the procedure advances to S203. If the chuck cleaning has not been executed yet, the procedure advances to S204, and the chuck cleaning is executed. After executing the chuck cleaning, the variable for the chuck cleaning execution state is set to a value indicating that the chuck cleaning has been already executed (S205).

In S203, it is determined whether or not a foreign substance is detected again within a predetermined area including the position at which a foreign substance was previously detected. In this embodiment, it is determined whether or not the positional information (CHSP) of a foreign substance at the same position between wafers in a current lot (L) and the positional information (BHSP) of a foreign substance at the same position between wafers in a lot (L-1) immediately therebefore have positions that match each other. If the positions do not match each other, the procedure advances to S204, and the chuck cleaning is executed. On the other hand, if the positions match each other, it is judged that the chuck cleaning was previously executed but was not enough to realize the removal effect and the foreign substance has been fixed to the wafer chuck. In this case, further repetition of the cleaning may be in vain and, in many cases, merely lowers the productivity. Thus, in this case, a next pattern forming operation is performed without executing the cleaning operation in S204.

In this embodiment, the process in S206 is performed as the next pattern forming operation. In this example, there is a foreign substance that cannot be removed even by chuck cleaning, and, thus, a shot including the same position in the CHSP and the BHSP obtained in S203 is obtained, and setting is performed such that the focus tracking for that shot in subsequent wafers is improved. Thus, even if there is a foreign substance that cannot be removed, defocus can be suppressed within the tolerance, so that the yield can be improved. Furthermore, there is the effect of suppressing a decrease in the productivity and unnecessary wear in the cleaning plate due to chuck cleaning performed in vain.

Figure 11A:
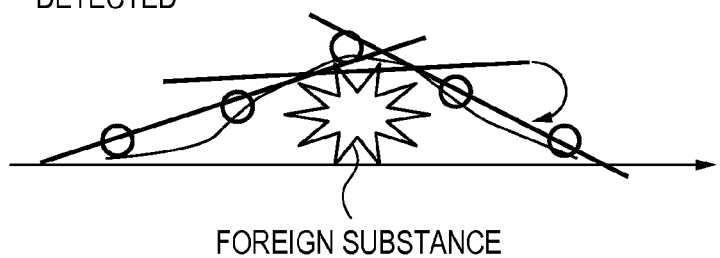
FIGS. 11A and 11B are views illustrating a relationship between the scanning speed and the focus tracking.
Figure 11B:

FIGS. 11A and 11B are schematic views illustrating a relationship between the scanning speed and the focus tracking. FIG. 11A shows a state before setting for the tracking improvement, and FIG. 11B shows a state after setting for the tracking improvement. If the scanning speed is lowered, the focus measurement pitch and the focus control pitch in the scanning direction can be made smaller, so that the wafer stage can track roughness on the wafer surface caused by a foreign substance on the chuck.

Hereinafter, a decrease in the productivity caused by locally lowering the scanning speed will be described. For example, it is assumed that the production is performed in the conditions that the field of view in Y is 33 mm and the scanning speed is 500 mm/sec. Assuming that one foreign substance is detected on the chuck and the scanning speed is halved to 250 mm/sec, the processing time becomes longer by 66 msec per shot. On the other hand, it is assumed that it takes half a day to resume the production after detaching the chuck and removing the foreign substance using an external cleaning apparatus. In that case, the influence by the delay by 66 msec per shot in each wafer exceeds that by the downtime for half a day, if the number of wafers processed reaches at least 654545 (=12 hours/66 msec). This number corresponds to the production amount for 218 days in a case where the production amount per day is 3000. In ordinary apparatus operation, it seems that there is scheduled downtime for half a day for regularly replacing parts in which wear occurs or upgrading software, long plant shutdown for successive days, or the like. Accordingly, if foreign substances are removed by an external cleaning apparatus in parallel at that time, sufficient effect can be achieved without stopping the apparatus for cleaning the chuck using the external apparatus.

Figure 7:
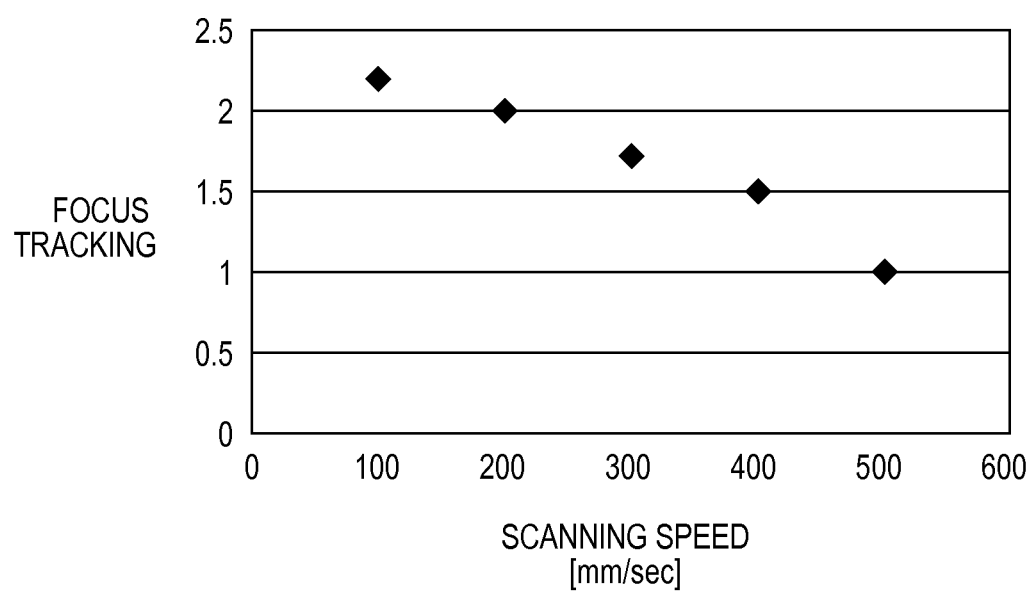
FIG. 7 is a graph indicating a relationship between the scanning speed and the focus tracking.

FIG. 7 shows a correlation between the scanning speed and the focus tracking. In FIG. 7, the horizontal axis indicates the scanning speed, and the vertical axis indicates focus tracking value when the focus tracking at the maximum scanning speed is taken as 1.0. The correlation graph may be obtained, for example, by performing focus measurement in advance using pilot wafers while changing the scanning speed, and obtaining a tracking failure amount at each scanning speed. The focus tracking is improved by changing the scanning speed based on this correlation. The degree by which the focus tracking has to be improved can be obtained, for example, using a value obtained by dividing the size of a foreign substance by the foreign substance determination threshold.

In S207, the positional information (CHSP) of a foreign substance in the current lot (L) is stored in the BHSP for the processing on the next lot (L+1). In S208, the lot processing number is incremented by 1. In S209, it is determined whether or not all lots loaded into the exposure apparatus have been processed. If there is a lot that has not been processed yet, the procedure returns to S300, and the next lot is processed. If all lots have been processed, the procedure is ended.

Second Embodiment

Figure 3:
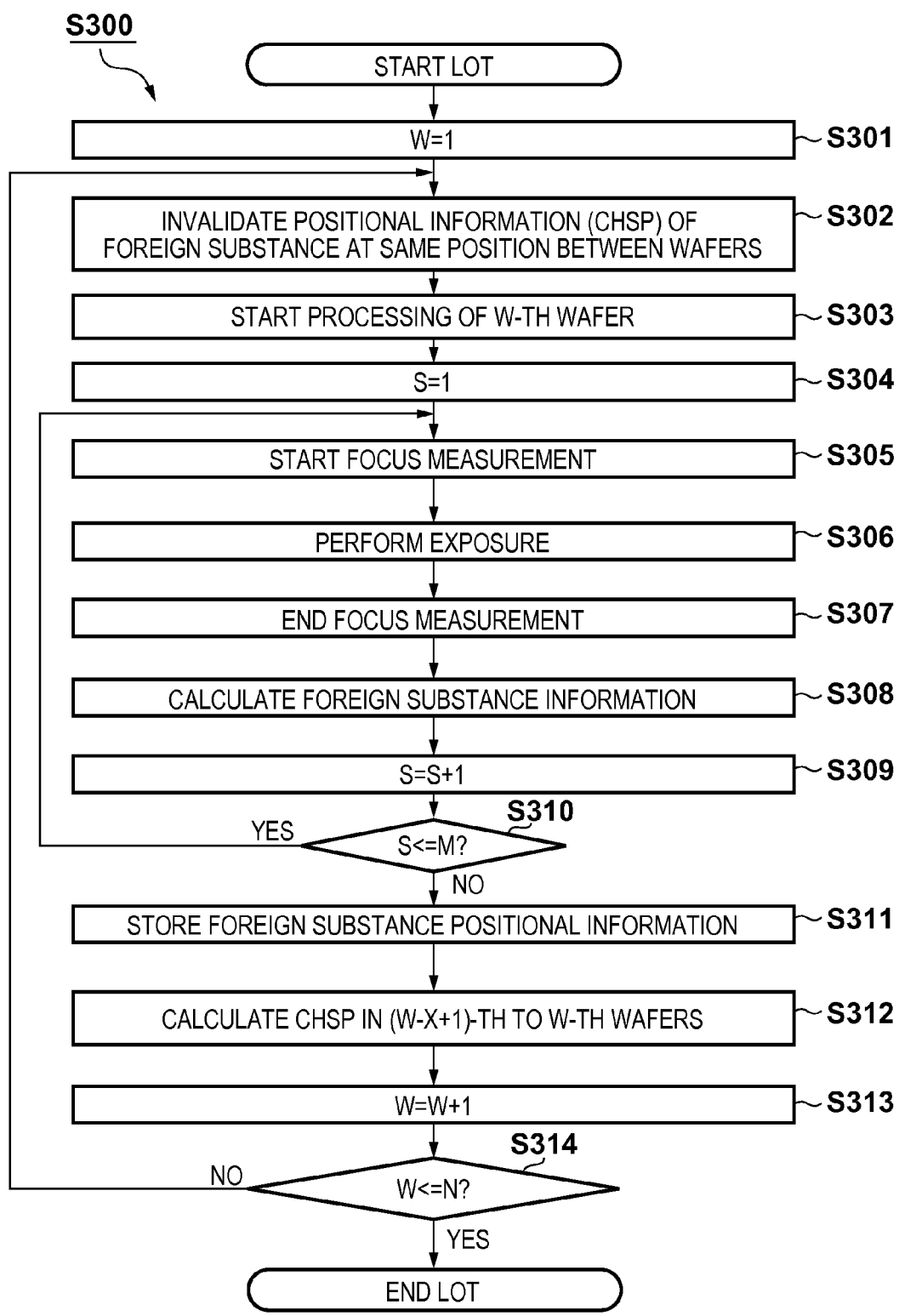
FIG. 3 is a flowchart of an exposure processing sequence in the first embodiment.
Figure 4A:
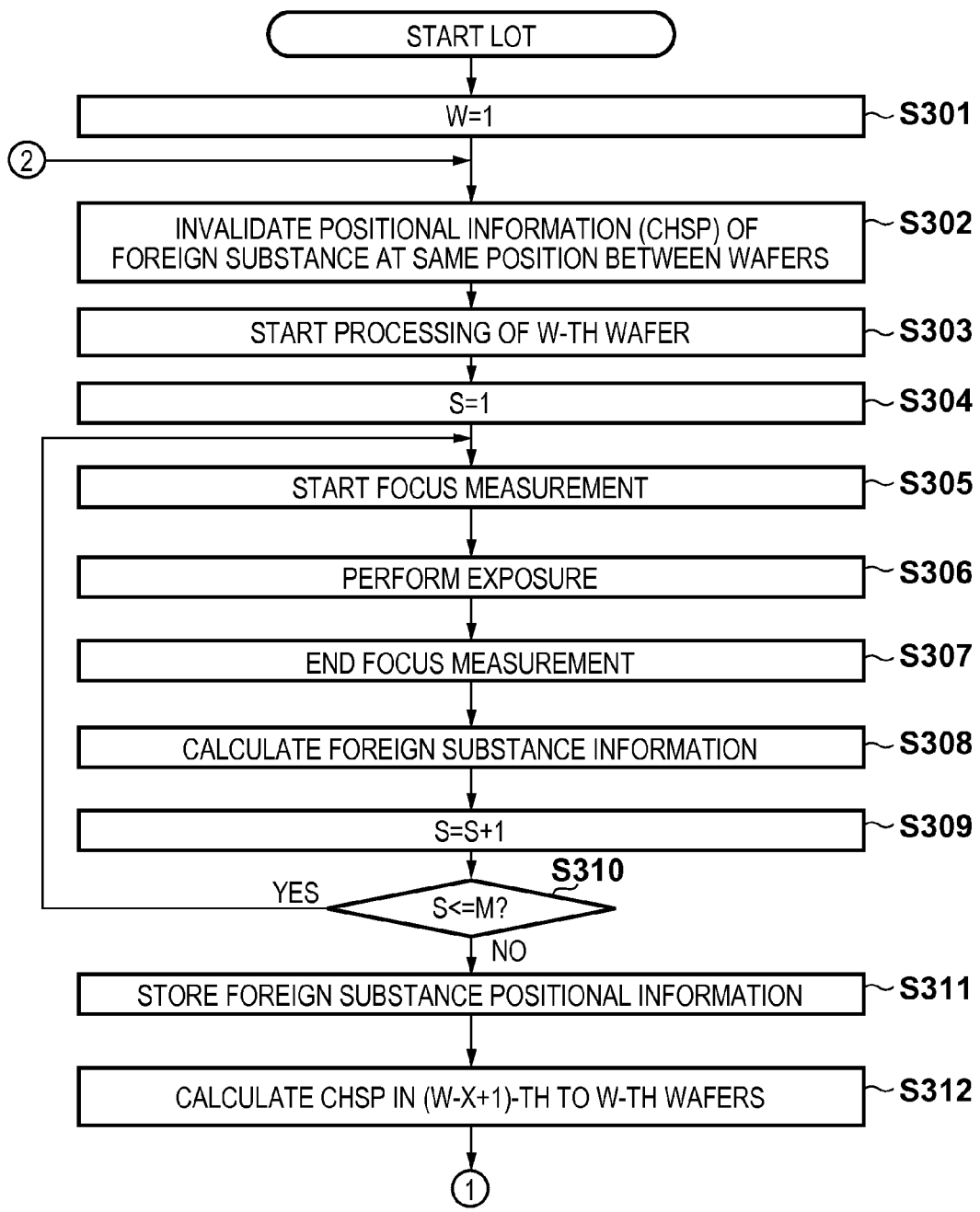
FIGS. 4A and 4B are flowcharts of an exposure processing sequence in a second embodiment.
Figure 4B:
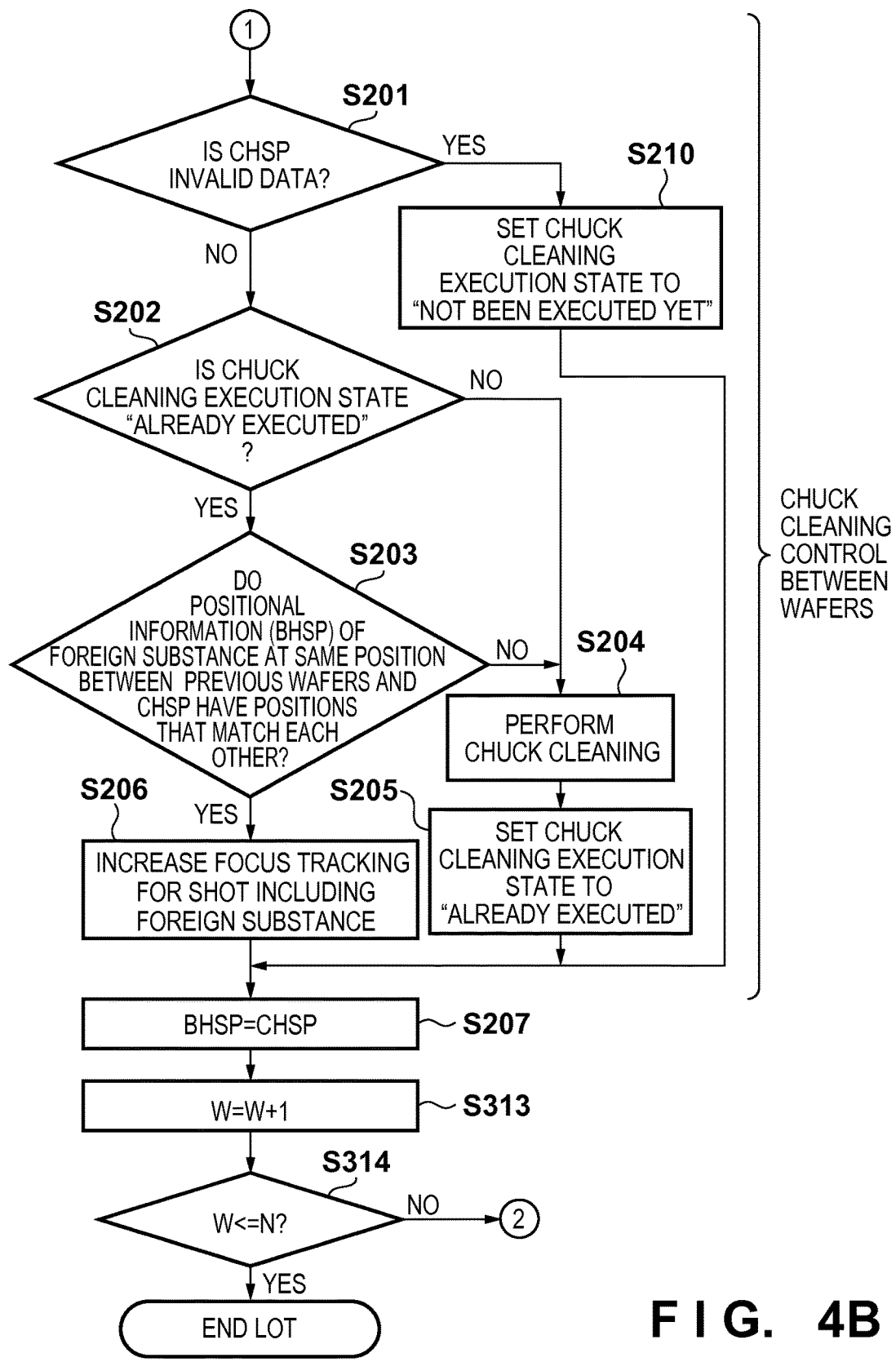

Next, an exposure processing sequence according to a second embodiment will be described with reference to FIGS. 4A and 4B. The configuration of the exposure apparatus is as in the first embodiment. In FIGS. 4A and 4B, the same processing blocks as in FIGS. 2 and 3 are denoted by the same reference numerals, and a detailed description thereof has been omitted.

Although the chuck cleaning control is performed between lots in the first embodiment, in the second embodiment, the chuck cleaning control is performed between substrates in a lot. Accordingly, the flowcharts in FIGS. 4A and 4B are such that the processes in S201 to S207 in FIG. 2 are interposed between S312 and S313 in FIG. 3.

According to the flowchart in FIGS. 4A and 4B, for each wafer in a lot, it is determined whether a foreign substance is on the chuck or on the wafer, and control for the chuck cleaning and the focus tracking improvement are performed. In the first embodiment, determination of a foreign substance on the chuck is performed between lots, and, thus, the effect of the setting for the chuck cleaning and the focus tracking improvement is not reflected until the next lot. On the other hand, in this embodiment, determination of a foreign substance on the chuck is performed between wafers. Thus, the effect of the setting for the chuck cleaning and the focus tracking improvement can be reflected from a wafer immediately after the wafer at which a foreign substance on the chuck was detected.

Third Embodiment

Next, a third embodiment will be described with reference to FIGS. 5 and 6. The configuration of the exposure apparatus is as in the first embodiment. FIG. 5 is a flowchart of an exposure processing sequence in a lot, and is the same as the flowchart in FIG. 3 according to the first embodiment, except that the processes in S302 and S312 are not performed.

Figure 6:
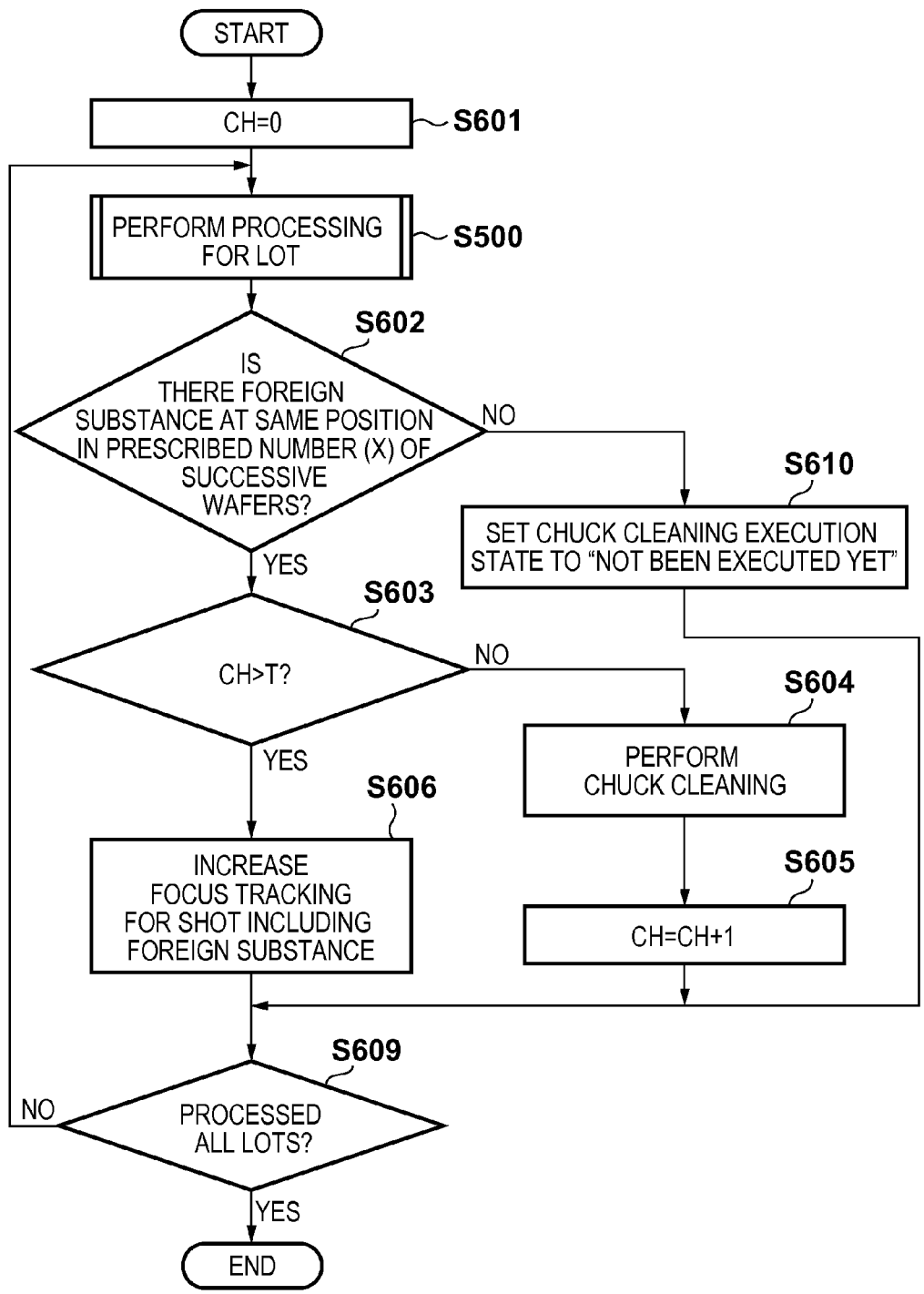
FIG. 6 is a flowchart of an exposure processing sequence in the third embodiment.

FIG. 6 is a flowchart of a lot processing sequence. First, the number (CH) of successive repetitions of the chuck cleaning operation is initialized to 0. CH is incremented by 1 if a foreign substance on the chuck is detected in a lot immediately after the chuck cleaning was executed. That is to say, CH indicates the number of times that the chuck cleaning is executed in vain.

Next, the exposure processing sequence shown in FIG. 5 is performed (S500). Subsequently, it is determined whether or not a foreign substance is detected at the same position in a prescribed number (X) of successive wafers (S602). Whether or not the positions are the same is determined, for example, according to whether or not the XY coordinates of the detected positions are within a certain range. If a foreign substance is detected at the same position in the prescribed number of successive wafers, it is judged that the foreign substance is on the chuck, and the procedure advances to S603. If not, the procedure advances to S610.

In S610, the variable for the chuck cleaning execution state is set to a value indicating that the chuck cleaning has not been executed yet. On the other hand, in S603, it is determined whether or not the number (CH) of successive repetitions of the chuck cleaning is greater than a predetermined number (T) of executions of the chuck cleaning. If CH is greater than T, it is indicated that a foreign substance has not been removed although the chuck cleaning was performed T times. In this case, the procedure advances to S606. If CH is not greater than T, the procedure advances to S604. If T=1, S603 is the same as S203 in the first embodiment.

In S604, chuck cleaning is executed. In S605, the number (CH) of successive repetitions of the chuck cleaning is incremented by 1.

On the other hand, after a predetermined number of executions of the cleaning operation in S603, the procedure advances to S606 where a next pattern forming operation is performed without executing the cleaning operation. In S606, since there is a foreign substance that cannot be removed even by chuck cleaning, a shot including the position of the foreign substance obtained in S602 is obtained, and setting is performed such that the focus tracking for that shot in subsequent wafers is improved. Thus, even if there is a foreign substance that cannot be removed and the foreign substance is moved on the chuck by the cleaning operation but cannot be removed, defocus can be suppressed within the tolerance. Accordingly, the yield can be improved. Furthermore, there is the effect of suppressing a decrease in the productivity and unnecessary wear in the cleaning plate due to chuck cleaning performed in vain.

In S609, it is determined whether or not all lots loaded into the exposure apparatus have been processed. If there is a lot that has not been processed yet, the procedure returns to S500, and the next lot is processed. If all lots have been processed, the procedure is ended.

Other Embodiments of Lithography Apparatus

In the foregoing first, second, and third embodiments, an exposure apparatus in which a pattern formed in a mask is projected on a shot region of a substrate using a projection optical system so that the pattern of the mask is transferred to the shot region is used as the lithography apparatus. However, the lithography apparatus may be an imprint apparatus in which an imprint material on a substrate is molded using a mold in which a pattern is formed. Alternatively, the lithography apparatus may be a charged particle beam exposure apparatus in which a pattern formed in an original is exposed on a substrate.

Other Embodiments of Article Manufacturing Method

The article manufacturing method according to the foregoing embodiments of the present invention is preferable for manufacturing an article such as, for example, microdevices such as semiconductor devices, elements having microstructure, and the like. The article manufacturing method of this embodiment includes transferring a pattern of an original to a substrate using the above-described lithography apparatus (exposure apparatus, imprint apparatus, rendering apparatus, etc.), and processing the substrate to which the pattern was transferred in the above step. This manufacturing method further includes other well-known processes (oxidation, film-formation, vacuum evaporation, doping, flattening, etching, resist removal, dicing, bonding, packaging, etc.). The article manufacturing method of this embodiment is more advantageous than conventional methods at least one of the article performance, the quality, the productivity, and the production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-255376, filed Dec. 10, 2013, which is hereby incorporated by reference herein in its entirety.

What is claimed is:

1. A lithography apparatus for forming a pattern on a substrate, comprising:
   a substrate holder configured to hold the substrate;
   a cleaning unit configured to perform cleaning of the substrate holder;
   a detector configured to detect a foreign substance by observing the substrate held by the substrate holder; and
   a controller configured to control execution of a pattern forming operation on the substrate and a cleaning operation by the cleaning unit;
   wherein the controller operates such that, in a case where a foreign substance is detected out of a predetermined area including a position at which a foreign substance was previously detected after a predetermined number of executions of the cleaning operation, a next pattern forming operation is performed after executing the cleaning operation, and in a case where a foreign substance is detected again within the predetermined area after the predetermined number of executions of the cleaning operation, a next pattern forming operation is performed without executing the cleaning operation, wherein the lithography apparatus forms a pattern on a first substrate and a second substrate which is processed next to the first substrate, wherein when the controller controls execution of pattern forming operation on the first substrate and the second substrate, the controller controls execution of the cleaning operation after processing the first substrate and before processing the second substrate.

2. A lithography apparatus for forming a pattern on a substrate, comprising:

a substrate holder configured to hold the substrate;

a cleaning unit configured to perform cleaning of the substrate holder;

a detector configured to detect a foreign substance by observing the substrate held by the substrate holder; and a controller configured to control execution of a pattern forming operation on the substrate and a cleaning operation by the cleaning unit;

wherein the controller operates such that, in a case where a foreign substance is detected out of a predetermined area including a position at which a foreign substance was previously detected after a predetermined number of executions of the cleaning operation, a next pattern forming operation is performed after executing the cleaning operation, and in a case where a foreign substance is detected again within the predetermined area after the predetermined number of executions of the cleaning operation, a next pattern forming operation is performed without executing the cleaning operation, wherein when the controller controls execution of pattern forming operations on substrates in a first lot and a second lot which is processed next to the first lot, the controller controls execution of the cleaning operation after processing the first lot and before processing the second lot.

3. The lithography apparatus according to claim 1, wherein the lithography apparatus is an exposure apparatus in which a pattern formed in a mask is projected on the substrate held by the substrate holder so that the substrate is exposed, in a next exposure operation to be performed without executing the cleaning operation in a case where a foreign substance is detected again within the predetermined area after the predetermined number of executions of the cleaning operation, the controller lowers a scanning speed in exposure of a region including the position at which the foreign substance is detected.

4. The lithography apparatus according to claim 1, wherein the lithography apparatus is an imprint apparatus in which an imprint material on the substrate is molded using a mold in which a pattern is formed.

5. The lithography apparatus according to claim 1, wherein the lithography apparatus is a charged particle beam exposure apparatus in which a pattern formed in an original is exposed on the substrate.

6. A processing method for forming a pattern on a substrate, comprising:

detecting a foreign substance on a substrate holder configured to hold the substrate; and performing a cleaning operation of the substrate holder by driving a cleaning unit;

wherein, in a case where a foreign substance is detected out of a predetermined area including a position at which a foreign substance was previously detected after a predetermined number of executions of the cleaning operation, a next pattern forming operation is performed after executing the cleaning operation, and in a case where a foreign substance is detected again within the predetermined area after the predetermined number of executions of the cleaning operation, a next pattern forming operation is performed while lowering a scanning speed of the substrate holder, without executing the cleaning operation, wherein the method is performed for forming a pattern on a first substrate and a second substrate which is processed next to the first substrate, wherein when pattern forming operations on substrates in the first substrate and the second substrate, the cleaning operation after processing the first substrate and before processing the second substrate is executed.

7. An method of manufacturing an article, the method comprising:

forming a pattern on a substrate using an lithography apparatus; and processing the substrate, on which the pattern has been formed, to manufacture the article, wherein the lithography apparatus includes:

a substrate holder configured to hold the substrate, a cleaning unit configured to perform cleaning of the substrate holder, a detector configured to detect a foreign substance by observing the substrate held by the substrate holder, and a controller configured to control execution of a pattern forming operation on the substrate and a cleaning operation by the cleaning unit, wherein the controller operates such that, in a case where a foreign substance is detected out of a predetermined area including a position at which a foreign substance was previously detected after a predetermined number of executions of the cleaning operation, a next pattern forming operation is performed after executing the cleaning operation, and, in a case where a foreign substance is detected again within the predetermined area after the predetermined number of executions of the cleaning operation, a next pattern forming operation is performed without executing the cleaning operation, wherein the lithography apparatus forms a pattern on a first substrate and a second substrate which is processed next to the first substrate, wherein when pattern forming operations on substrates in the first substrate and the second substrate, the cleaning operation after processing the first substrate and before processing the second substrate is executed.

8. A lithography apparatus for forming a pattern on a substrate, comprising:

a substrate holder configured to hold the substrate;

a cleaning unit configured to perform cleaning of the substrate holder;

a detector configured to detect a foreign substance by observing the substrate held by the substrate holder; and a controller configured to control execution of a pattern forming operation on the substrate and a cleaning operation by the cleaning unit;

wherein the controller operates such that,
in a case where a foreign substance is detected within a predetermined area including a position at which a foreign substance was previously detected before a predetermined number of executions of the cleaning operation, a next pattern forming operation is performed after executing the cleaning operation, and in a case where a foreign substance is detected again within the predetermined area after the predetermined number of executions of the cleaning operation, a next pattern forming operation is performed without executing the cleaning operation, wherein the lithography apparatus forms a pattern on a first substrate and a second substrate which is processed next to the first substrate, wherein when the controller controls execution of pattern forming operation on the first substrate and the second substrate, the controller controls execution of the cleaning operation after processing the first substrate and before processing the second substrate.

9. A lithography apparatus for forming a pattern on a substrate, comprising:

a substrate holder configured to hold the substrate;
a cleaning unit configured to perform cleaning of the substrate holder;
a detector configured to detect a foreign substance by observing the substrate held by the substrate holder; and
a controller configured to control execution of a pattern forming operation on the substrate and a cleaning operation by the cleaning unit;
wherein the controller operates such that,
in a case where a foreign substance is detected within a predetermined area including a position at which a foreign substance was previously detected before a predetermined number of executions of the cleaning operation, a next pattern forming operation is performed after executing the cleaning operation, and
in a case where a foreign substance is detected again within the predetermined area after the predetermined number of executions of the cleaning operation, a next pattern forming operation is performed without executing the cleaning operation,
wherein when the controller controls execution of pattern forming operations on substrates in a first lot and a second lot which is processed next to the first lot, the controller controls execution of the cleaning operation after processing the first lot and before processing the second lot.

10. The lithography apparatus according to claim 8,
wherein the lithography apparatus is an exposure apparatus in which a pattern formed in a mask is projected on the substrate held by the substrate holder so that the substrate is exposed,
in a next exposure operation performed without executing the cleaning operation in a case where a foreign substance is detected again within a predetermined area after the predetermined number of executions of the cleaning operation, the controller lowers a scanning speed in exposure of a region including the position at which the foreign substance is detected.

11. The lithography apparatus according to claim 8, wherein the lithography apparatus is an imprint apparatus in which an imprint material on the substrate is molded using a mold in which a pattern is formed.

12. The lithography apparatus according to claim 8, wherein the lithography apparatus is a charged particle beam exposure apparatus in which a pattern formed in an original is exposed on the substrate.

13. A processing method for forming a pattern on a substrate, comprising:

detecting a foreign substance on a substrate holder configured to hold the substrate; and
performing a cleaning operation of the substrate holder by driving a cleaning unit;
wherein, in a case where a foreign substance is detected within a predetermined area including a position at which a foreign substance was previously detected before a predetermined number of executions of the cleaning operation, a next pattern forming operation is performed after executing the cleaning operation, and
in a case where a foreign substance is detected again within the predetermined area after the predetermined number of executions of the cleaning operation, a next pattern forming operation is performed while lowering a scanning speed of the substrate holder, without executing the cleaning operation,
wherein the method is performed for forming a pattern on a first substrate and a second substrate which is processed next to the first substrate,
wherein when pattern forming operations on substrates in the first substrate and the second substrate, the cleaning operation after processing the first substrate and before processing the second substrate is executed.

14. An method of manufacturing an article, the method comprising:

forming a pattern on a substrate using an lithography apparatus; and
processing the substrate, on which the pattern has been formed, to manufacture the article,
wherein the lithography apparatus includes:
a substrate holder configured to hold the substrate,
a cleaning unit configured to perform cleaning of the substrate holder,
a detector configured to detect a foreign substance by observing the substrate held by the substrate holder, and
a controller configured to control execution of a pattern forming operation on the substrate and a cleaning operation by the cleaning unit,
wherein the controller operates such that,
in a case where a foreign substance is detected within a predetermined area including a position at which a foreign substance was previously detected before a predetermined number of executions of the cleaning operation, a next pattern forming operation is performed after executing the cleaning operation, and,
in a case where a foreign substance is detected again within the predetermined area after the predetermined number of executions of the cleaning operation, a next pattern forming operation is performed without executing the cleaning operation,
wherein the method is performed for forming a pattern on a first substrate and a second substrate which is processed next to the first substrate, wherein when the controller controls execution of pattern forming operation on the first substrate and the second substrate, the controller controls execution of the cleaning operation after processing the first substrate and before processing the second substrate.

15. A processing method for forming a pattern on a substrate, comprising:
   detecting a foreign substance on a substrate holder configured to hold the substrate; and
   performing a cleaning operation of the substrate holder by driving a cleaning unit;
   wherein, in a case where a foreign substance is detected out of a predetermined area including a position at which a foreign substance was previously detected after a predetermined number of executions of the cleaning operation, a next pattern forming operation is performed after executing the cleaning operation, and
   in a case where a foreign substance is detected again within the predetermined area after the predetermined number of executions of the cleaning operation, a next pattern forming operation is performed while lowering a scanning speed of the substrate holder, without executing the cleaning operation,
   wherein when pattern forming operations on substrates in a first lot and a second lot which is processed next to the first lot are executed, the cleaning operation after processing the first lot and before processing the second lot is executed.

16. An method of manufacturing an article, the method comprising:
   forming a pattern on a substrate using an lithography apparatus; and
   processing the substrate, on which the pattern has been formed, to manufacture the article,
   wherein the lithography apparatus includes:
   a substrate holder configured to hold the substrate,
   a cleaning unit configured to perform cleaning of the substrate holder,
   a detector configured to detect a foreign substance by observing the substrate held by the substrate holder, and
   a controller configured to control execution of a pattern forming operation on the substrate and a cleaning operation by the cleaning unit,
   wherein the controller operates such that,
      in a case where a foreign substance is detected out of a predetermined area including a position at which a foreign substance was previously detected after a predetermined number of executions of the cleaning operation, a next pattern forming operation is performed after executing the cleaning operation, and,
      in a case where a foreign substance is detected again within the predetermined area after the predetermined number of executions of the cleaning operation, a next pattern forming operation is performed without executing the cleaning operation,
   wherein when the controller controls execution of pattern forming operations on substrates in a first lot and a second lot which is processed next to the first lot, the controller controls execution of the cleaning operation after processing the first lot and before processing the second lot.

17. A processing method for forming a pattern on a substrate, comprising:
   detecting a foreign substance on a substrate holder configured to hold the substrate; and
   performing a cleaning operation of the substrate holder by driving a cleaning unit;
   wherein, in a case where a foreign substance is detected within a predetermined area including a position at which a foreign substance was previously detected before a predetermined number of executions of the cleaning operation, a next pattern forming operation is performed after executing the cleaning operation, and
   in a case where a foreign substance is detected again within the predetermined area after the predetermined number of executions of the cleaning operation, a next pattern forming operation is performed without executing the cleaning operation,
   wherein when pattern forming operations on substrates in a first lot and a second lot which is processed next to the first lot are executed, the cleaning operation after processing the first lot and before processing the second lot is executed.

18. An method of manufacturing an article, the method comprising:
   forming a pattern on a substrate using an lithography apparatus; and
   processing the substrate, on which the pattern has been formed, to manufacture the article,
   wherein the lithography apparatus includes:
   a substrate holder configured to hold the substrate,
   a cleaning unit configured to perform cleaning of the substrate holder,
   a detector configured to detect a foreign substance by observing the substrate held by the substrate holder, and
   a controller configured to control execution of a pattern forming operation on the substrate and a cleaning operation by the cleaning unit,
   wherein the controller operates such that,
      in a case where a foreign substance is detected within a predetermined area including a position at which a foreign substance was previously detected before a predetermined number of executions of the cleaning operation, a next pattern forming operation is performed after executing the cleaning operation, and,
      in a case where a foreign substance is detected again within the predetermined area after the predetermined number of executions of the cleaning operation, a next pattern forming operation is performed without executing the cleaning operation,
   wherein when the controller controls execution of pattern forming operations on substrates in a first lot and a second lot which is processed next to the first lot, the controller controls execution of the cleaning operation after processing the first lot and before processing the second lot.

* * * * *